US008471290B2

(12) United States Patent
Li

(10) Patent No.: US 8,471,290 B2
(45) Date of Patent: Jun. 25, 2013

(54) COMPOSITIONS AND METHODS FOR GENERATING WHITE LIGHT

(75) Inventor: Jing Li, Cranbury, NJ (US)

(73) Assignee: Rutgers. The State University of New Jersey, New Brunswick, NJ (US)

( * ) Notice: Subject to any disclaimer, the term of this patent is extended or adjusted under 35 U.S.C. 154(b) by 289 days.

(21) Appl. No.: 12/934,516

(22) PCT Filed: Mar. 24, 2009

(86) PCT No.: PCT/US2009/038136
§ 371 (c)(1), (2), (4) Date: Sep. 24, 2010

(87) PCT Pub. No.: WO2009/120716
PCT Pub. Date: Oct. 1, 2009

(65) Prior Publication Data
US 2011/0049560 A1    Mar. 3, 2011

Related U.S. Application Data

(60) Provisional application No. 61/038,894, filed on Mar. 24, 2008.

(51) Int. Cl.
H01L 33/00 (2010.01)
(52) U.S. Cl.
USPC ............... 257/103; 257/E33.001; 438/22
(58) Field of Classification Search
None
See application file for complete search history.

(56) References Cited

U.S. PATENT DOCUMENTS

| | | | |
|---|---|---|---|
| 2,698,915 A * | 1/1955 | Piper | 315/362 |
| 5,751,018 A | 5/1998 | Alivisatos et al. | |
| 5,783,292 A | 7/1998 | Tokito et al. | |
| 5,871,579 A | 2/1999 | Liang et al. | |
| 6,420,056 B1 | 7/2002 | Chondroudis et al. | |
| 6,548,168 B1 | 4/2003 | Mulvaney et al. | |
| 6,563,186 B2 | 5/2003 | Li et al. | |
| 7,235,190 B1 | 6/2007 | Wilcoxon et al. | |
| RE41,427 E | 7/2010 | Li et al. | |
| 2002/0149076 A1 | 10/2002 | Li et al. | |

(Continued)

FOREIGN PATENT DOCUMENTS

EP    0 481 362 A2    4/1992

OTHER PUBLICATIONS

Huang et al., J. Am. Chem. Soc., 129, 3157-3162 (2007).*

(Continued)

Primary Examiner — Julio J Maldonado
Assistant Examiner — Sonya D McCall Shepard
(74) Attorney, Agent, or Firm — Fox Rothschild LLP

(57) ABSTRACT

Crystalline inorganic-organic hybrid structures having a plurality of layers of a repeating unit characterized by a first organic ligand layer, a second organic ligand layer, and a two-dimensional semiconducting inorganic double layer having two opposing surfaces therebetween, wherein the two-dimensional semiconducting inorganic double layer is characterized by two single atom thick layers of a II-VI chalcogenide compound; and the first organic ligand layer and the second organic ligand layer are attached to the two opposing surfaces of the two-dimensional semiconducting inorganic double layer through a covalent bond or a coordinate covalent bond between the compounds of the organic ligand layers and the metal cation species of the II-VI chalcogenide compounds, so that the semiconducting inorganic double layer is directed by the compounds of the two opposing organic layers to form ordered crystal lattices. Methods for the preparation of the hybrid structures are also disclosed.

25 Claims, 11 Drawing Sheets

U.S. PATENT DOCUMENTS

| | | |
|---|---|---|
| 2002/0155319 A1 | 10/2002 | Kawamura et al. |
| 2003/0008520 A1 | 1/2003 | Bojarczuk et al. |
| 2007/0024175 A1 | 2/2007 | Chua et al. |
| 2007/0069202 A1* | 3/2007 | Choi et al. ............. 257/40 |
| 2007/0132052 A1 | 6/2007 | Sargent et al. |

OTHER PUBLICATIONS

Colvin, et al: "Light-Emitting Diodes made from Cadmium Selenide Nanocystals and a Semiconducting Polymer," Nature, 370, pp. 354-357; Aug. 1994.

Jones et al., "The Luminescence of Manganese-doped Zinc Selenide," J. Phys. D: Appl. Phys. (1973): vol. 6; pp. 1640-1651.

Zheng et al., "Zero- and Two-Dimensional Organization of Tetrahedral Cadmium Chalcogenide Clusters with Bifunctional Covalent Linkers," Chem. Mater (2006): vol. 18; pp. 4307-4311.

Ali et al., "White-light Emission from a Blend of CdSeS Nanocrystals of Different Se: S ratio," Nanotechnology (2007): vol. 18; pp. 1-4.

International Search Report and Written Opinion issued for PCT/US09/38136, Jul. 2, 2009.

* cited by examiner

2D-[Cd$_2$S$_2$(ba)]

[Cd₂S₂] double layer (a)   (b)   (c)   (d)

2D-[Cd$_2$S$_2$(ba)]
(ba = n-butylamine)

3D-[Cd$_2$S$_2$(bda)]
(bda = n-butyldiamine)

COMPOSITIONS AND METHODS FOR GENERATING WHITE LIGHT

CROSS-REFERENCE TO RELATED APPLICATION

This application is a 35 U.S.C. §371 National Phase Application of PCT/US2009/038136 filed Mafiled Mar. 24, 2009, which claims the benefit of to U.S. Provisional Patent Application No. 61/038,894, filed on Mar. 24, 2008, the disclosures of which are incorporated herein by reference.

STATEMENT OF GOVERNMENT SPONSORED RESEARCH

The U.S. Government has a paid-up license in this invention and the right in limited circumstances to require the patent owner to license others on reasonable terms as provided for by the terms of Grant No. DMR-0422932 awarded by the National Science Foundation.

FIELD OF THE INVENTION

The present invention concerns novel crystalline inorganic-organic hybrid compounds, which possess semiconducting properties and are capable of generating white light directly when used as a phosphor in light emitting diodes (LEDs).

BACKGROUND OF THE INVENTION

Solid-state lighting (SSL) is an energy-saving lighting technology. Light-emitting diodes (LED) and organic light-emitting diodes (OLED) are two main branches of SSL technology that are evolving rapidly in recent years (Optoelectronics Industry Development Association, *The Promise of Solid State Lighting for General Illumination*; Washington, DC, 2001). Utilizing semiconductor materials, SSL devices convert electricity to light much more effectively than conventional lighting sources. Additionally, they contribute to the reduction of green house gases and offer a cleaner environment (Uchida et al., *Optical Energy*, 44, 124003-1 (2005); Taguchi, *Proc. SPIE* 5530, 7-16 (2004); Taguchi, *J. Light Visual Environ.* 27, 131 (2003)). Solar powered LEDs can make direct use of renewable energy for our society's lighting needs (See, e.g., Xiao et al., *Inorg. Chem.* 42, 107-111 (2003)). It has been estimated that an approximate 29% reduction of US and 50% reduction of global energy consumption for lighting could be reached by 2020 as a result of solid-state lighting applications (Navigant Consulting Inc., *Energy Savings Potential of Solid State Lighting in General Illumination Applications*, Washington, DC (2003); Bergh et al., *Phys. Today* 54, 42-47 (2001)).

White-light LEDs, which have great potential for general lighting applications, are produced by either mixing of red, green and blue (RGB) LEDs, or by phosphor conversion, in which white light is generated by coating a blue or near-UV LED with a yellow or multichromatic phosphor (See, e.g., Uchida et al., *Optical Energy*, 44, 124003-1 (2005)). However, both processes are associated with complex issues and schemes, and significant reduction of device efficiency due to problems such as self absorption, relatively low light capture efficiency of phosphors or non-radiative carrier losses (See, e.g., Mueller et al., *Nano Lett.* 5, 1039-1044 (2005); Yang et al., *Chem. Mater.*, 17 3883-3888 (2005)).

A recent discovery shows that ultra-small (magic-sized) CdSe nanocrystals (NCs) give rise to a broad (white-light) emission covering the entire visible spectrum (Bowers et al., *J. Am. Chem. Soc.*, 127, 1537815379 (2005)), as a direct result of very high surface-to-volume ratio and thus, a significantly larger number of mid-gap surface sites. While they may offer some advantages over other phosphors, weak correlations among the nanocrystals limit their uses as direct white-light emitting diodes, because of the difficulties in achieving high conductivity and mobility required by a LED device. A more desirable and potentially economical approach is to develop semiconductor bulk materials that can be used as direct white-light emitting diodes.

SUMMARY OF THE INVENTION

The present invention provides a desirable and potentially economical approach to developing semiconductor bulk materials that can be used as direct white-light emitting diodes. In particular, the present disclosure provides compositions and structures of a unique family of inorganic-organic semiconductor bulk materials, which are capable of generating white light directly when used as a phosphor in light emitting diodes (LEDs), and methods for preparing these materials.

In a first aspect the present disclosure provides a crystalline inorganic-organic hybrid structure comprising a plurality of layers of a repeating unit, said repeating unit comprising a first organic ligand layer, a second organic ligand layer, and a semiconducting inorganic double layer therebetween.

In a second aspect the present disclosure provides a crystalline inorganic-organic hybrid compound, characterized by formula $M_2X_jY_{2-j}(L)$, wherein:
  M is a II-VI semiconductor cationic species;
  X and Y are chalcogens;
  L is an organic ligand compound; and
  j is a number in the range from 0 to 2.

In a third aspect the present disclosure provides a crystalline inorganic-organic hybrid compound characterized by formula $M_{2-x}Mn_xX_jY_{2-j}(L)$, wherein:
  M is a II-VI semiconductor cationic species;
  X and Y are chalcogens;
  L is an organic ligand compound;
  j is a number in the range from 0 to 2, inclusive; and
  x is a number in the range from 0 to 1.0, inclusive.

In a fourth aspect the present disclosure provides a method for preparing a crystalline inorganic-organic hybrid structure or compound as defined in the first, the second, or the third aspect of the disclosure.

In a fifth aspect the present disclosure provides a semiconductor device comprising the inorganic-organic hybrid structure or compound as described in the first, second, or third aspect of the present disclosure.

In a sixth aspect the present disclosure provides a light emitting device comprising an inorganic-organic hybrid structure or compound as described in the first, second, or third aspect of the present disclosure.

The highly crystalline materials of the present disclosure comprise predominantly two-dimensional layers of II-VI semiconductor motifs (inorganic component) that are directed by organic molecules (organic component) to form perfectly ordered crystal lattices (FIG. 1a-b). They not only possess a number of enhanced semiconductor properties with respect to their parent II-VI binary compounds (Huang et al., *J. Am. Chem. Soc.*, 125, 7049-7055 (2003); Huang et al., *J. Am. Chem. Soc.*, 129, 31573162 (2007)), but also exhibit a very strong structure-induced quantum confinement effect (QCE), to the same or higher extent as those of the smallest colloidal quantum dots (QDs) reported to date (Murray et al., Science, 270, 1335-1338 (1995); Nozik et al., *Mater. Res. Soc. Bulletin*, 23, 24 (1998)). An organic-inorganic hybrid quantum confined system comprising alternating single layers of bifunctional organic ligands and II-VI semiconducting chalcogenides has been disclosed by the present inventors in U.S. Pat. No. 6,563,186, which is hereby incorporated by reference in its entirety.

Like the magic-sized CdSe nanocrystals, the hybrid semiconductors disclosed herein emit over the entire visible region. More significantly, they represent the first single semi-conductor compound bulk materials that directly generate white light, and possess the following advantageous features compared with the NCs: (a) their crystal structures are well characterized; (b) the inorganic semiconductor components are strongly correlated within the layers, thus, allowing high electrical conductivity and carrier mobility required for LEDs; (c) the crystal structures and optical properties can be controlled and tailored precisely and systematically; and (d) they can be processed in bulk forms and have no limitations/restrictions on issues related to particle sizes.

DETAILED DESCRIPTION OF THE INVENTION

Figure 1A:
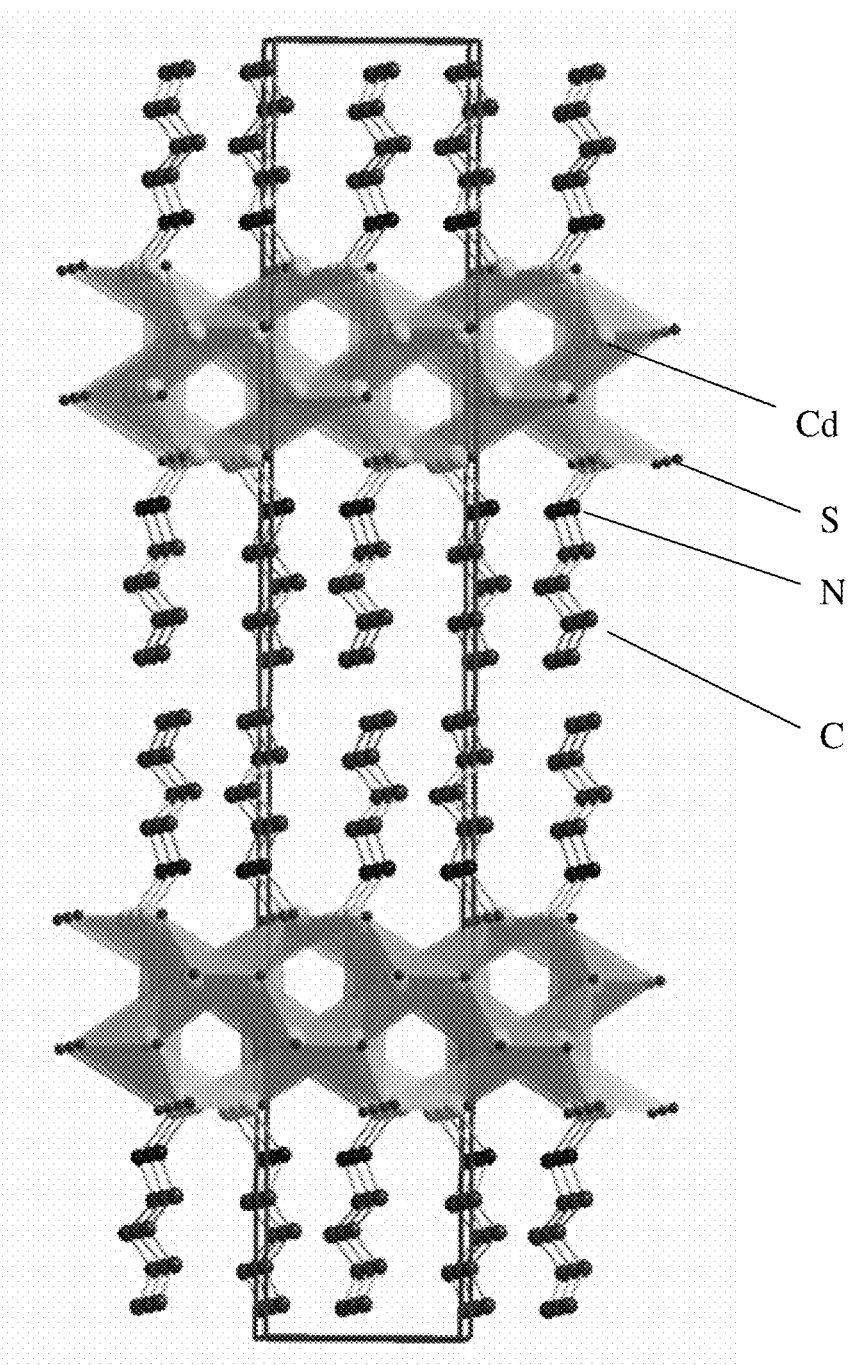
FIG. 1a is a pictorial representation of the crystal structure of 2D-[$Cd_2S_2$(ba)]. The side view of the crystal structure of the double-layer 2D-[$Cd_2S_2$(ba)] based crystal structure; cadmium is in dark gray; sulfur is represented by small solid spheres attached to the cadmium; nitrogen atoms are outlined in horizontal boxes; and C are black solid spheres.

In a first aspect the present disclosure provides a crystalline inorganic-organic hybrid structure comprising a plurality of layers of a repeating unit, said repeating unit comprising a first organic ligand layer, a second organic ligand layer, and a semiconducting inorganic double layer therebetween. The semiconducting inorganic double layer comprises two single one atom-thick layers of a II-VI semiconductor compound one on top of the other, in which the semiconductor cations and anions are bonded to one another both in the plane of each single atom thick layer and also between the cations and anions of both layers.

In a first embodiment of the first aspect, the present disclosure provides a crystalline inorganic-organic hybrid structure comprising a plurality of layers of a repeating unit, said repeating unit comprising a first organic ligand layer, a second organic ligand layer, and a two-dimensional semiconducting inorganic double layer having two opposing surfaces, wherein:

the two-dimensional semiconducting inorganic double layer comprises two layers of a II-VI chalcogenide compound;

wherein the first organic ligand layer and the second organic ligand layer are attached to the two opposing surfaces of the two-dimensional semiconducting inorganic double layer through a covalent bond or a coordinate covalent bond between the compounds of the organic ligand layers and the metal cation species of the II-VI chalcogenide compounds, so that the semi-conducting inorganic double layer is directed by the two opposing organic layers to form ordered crystal lattices.

In a second embodiment of the first aspect, the present disclosure provides a crystalline inorganic-organic hybrid structure, within the scope of the first embodiment, wherein the II-VI chalcogenide compound has the formula $M_2X_jY_{2-j}$, wherein:

M is Cd or Zn;

X and Y are each independently selected from S, Se and Te; and j is a number in the range of 0 to 2, inclusive.

In a third embodiment of the first aspect, the present disclosure provides a crystalline inorganic-organic hybrid structure, within the scope of the first embodiment, wherein the II-VI chalcogenide compound is selected from the group consisting of $Cd_2S_2$, $Cd_2Se_{0.5}S_{1.5}$, and $Cd_2Se_{1.25}S_{0.75}$.

In a fourth embodiment of the first aspect, the present disclosure provides a crystalline inorganic-organic hybrid structure, within the scope of the first embodiment, wherein the II-VI chalcogenide compound has the formula $M_{2-x}Mn_xX_jY_{2-j}$, wherein:

M is Cd or Zn;

X and Y are each a chalcogen independently selected from S, Se, and Te;

j is a number in the range from 0 to 2, inclusive; and x is a number in the range from 0 to about 1.0, inclusive.

In a fifth embodiment of the first aspect, the present disclosure provides a crystalline inorganic-organic hybrid structure, within the scope of the first embodiment, wherein the II-VI chalcogenide compound has the formula $Cd_{2-x}Mn_xSe_{0.5}S_{1.5}$, wherein x is a number ranging from 0 to about 1.0, inclusive. Examples of suitable ranges for x include values between about 0.025 and about 0.5, between about 0.05 and about 0.25, and between about 0.075 and about 0.15.

In a sixth embodiment of the first aspect, the present disclosure provides a crystalline inorganic-organic hybrid structure, within the scope of the first embodiment, wherein said first and said second organic ligand layers each comprise a layer of a neutral organic compound with a single functional group, or two identical or different functional groups, capable of binding to the II-VI semiconductor cationic species to form ordered crystal lattices, including, but not limited to, mono- or disubstituted organic amines, phosphines, and mercaptan compounds.

In a seventh embodiment of the first aspect, the present disclosure provides a crystalline inorganic-organic hybrid structure, wherein the first and said second organic ligand layers each comprise a layer of an neutral organic compound having the formula R—Q or Q—R—Q, wherein Q is $NH_2$, SH or $PH_2$, wherein R is selected from a $C_{2-9}$ alkyl or alkenyl group, a $C_{3-9}$ cycloalkyl or cycloalkenyl group, a $C_{6-12}$ aryl group, and a $C_{1-6}$ alkyl-$C_{6-12}$ aryl group, all of which are substituted or unsubstituted. The neutral organic compound can also have the formula R, wherein R is a heterocyclic compound containing 5 to 12 ring positions, at least one of which is NH, up to two additional ring positions are selected from NH, S and O, and the remainder of the ring positions are carbon atoms.

In an eighth embodiment of the first aspect, the present disclosure provides a crystalline inorganic-organic hybrid structure, within the scope of the first embodiment, wherein said first and said second organic ligand layers each comprise a layer of an organic amine compound selected from 1-ethylamine, 1-propylamine, 1-butylamine, 1-pentylamine, 1-hexyl-amine, aniline and 4,4-bis-pyridine (4,4-bpy).

In a ninth embodiment of the first aspect, the present disclosure provides a crystalline inorganic-organic hybrid structure capable of emitting a light over substantially the entire visible region, in the range of wavelength from about 380 nm to about 750 nm.

In a second aspect the present disclosure provides a crystalline inorganic-organic hybrid compound, characterized by formula $M_2X_jY_{2-j}(L)$, wherein:

M is a II-VI semiconductor cationic species;

X and Y are chalcogens;

L is an organic ligand compound; and j is a number in the range from 0 to 2.

In a first embodiment of the second aspect, the present disclosure provides a crystalline inorganic-organic hybrid compound, characterized by formula $M_2X_jY_{2-j}(L)$, wherein:

M is Cd or Zn;

X and Y are each a chalcogen independently selected from S, Se, and Te;

j is a number in the range from 0 to 2, inclusive; and

L is a $C_{2-9}$ alkylamine, a $C_{2-9}$ alkyl diamine, aniline or 4,4-bpy.

In a second embodiment of the second aspect, the present disclosure provides a crystalline inorganic-organic hybrid compound having the formula $M_2X_jY_{2-j}(L)$, wherein:

M is Cd;

X is Se;

Y is S;

j is selected from 0, 0.25, 0.5, 0.75, and 1.0; and

L is selected from 1-propylamine, 1-butylamine, 1-pentylamine, and 1-hexylamine.

In a third embodiment of the second aspect, the present disclosure provides a crystalline inorganic-organic hybrid compound selected from the group consisting of $Cd_2S_2(ba)$ and $Cd_2Se_{0.5}S_{1.5}(ba)$, wherein ba is 1-butylamine.

In a third aspect the present disclosure provides a crystalline inorganic-organic hybrid compound characterized by formula $M_{2-x}Mn_xX_jY_{2-j}(L)$, wherein:

M is a II-VI semiconductor cationic species;

X and Y are chalcogens;

L is an organic ligand compound;

j is a number in the range from 0 to 2, inclusive; and x is a number in the range from 0 to about 1.0, inclusive.

In a first embodiment of the third aspect, the present disclosure provides a crystalline inorganic-organic hybrid compound characterized by the formula $M_{2-x}Mn_xX_jY_{2-j}(L)$, wherein:

M is Cd or Zn;

X and Y are each a chalcogen independently selected from S, Se, and Te;

j is a number in the range from 0 to 2, inclusive;

x is a number in the range from 0 to about 1.0, inclusive; and

L is a $C_{2-9}$ alkylamine, a $C_{2-9}$ alkyl diamine, aniline or 4,4-bpy.

In a second embodiment of the third aspect, the present disclosure provides a crystalline inorganic-organic hybrid compound having the formula $M_{2-x}Mn_xX_jY_{2-j}(L)$, wherein:

M is Cd;

X is Se;

Y is S;

j is selected from 0, 0.25, 0.5, 0.75, and 1.0;

x is a number in the range from 0 to about 1.0; and

L is selected from 1-propylamine, 1-butylamine, 1-pentylamine, and 1-hexylamine.

In a third embodiment of the third aspect, the present disclosure provides a crystalline inorganic-organic hybrid compound selected from the group consisting of $Cd_{1-x}Mn_xS_2(ba)$, $Cd_{1-x}Mn_xSe_{0.5}S_{1.5}(ba)$, and $Cd_{1-x}Mn_xSe_{0.75}S_{1.25}(ba)$, wherein:

x is a number in the range from 0 to about 1.0, inclusive; and ba is 1-butylamine.

In a fourth aspect the present disclosure provides a method for preparing a crystalline inorganic-organic hybrid structure or compound as defined in the first, the second, or the third aspect of the disclosure.

In a first embodiment of the fourth aspect, the present disclosure provides a method for preparing a crystalline inorganic-organic hybrid structure or compound as defined in the first, the second, or the third aspect of the present disclosure, comprising a step of heating a mixture comprising:

(a) a salt of one or more II-VI semiconductor cationic species, (b) one or more chalcogens independently selected from S, Se and Te, and (c) an organic ligand compound capable of forming a covalent or coordinate bond with said II-VI semiconductor cationic species, to a temperature effective to form said hybrid structure or compound; and maintaining the mixture at or above the temperature until said hybrid structure or compound is formed.

In a second embodiment of the fourth aspect, the present disclosure provides a method for preparing a crystalline inorganic-organic hybrid structure or compound as defined in the first, the second, or the third aspect of the present disclosure, comprising a step of heating a mixture comprising:

(a) a salt of a cationic species selected from $Zn^{2+}$ and $Cd^{2+}$, (b) one or more chalcogens independently selected from S, Se, and Te, and (c) an organic amine or diamine, to a temperature effective to form said hybrid structure or compound; and maintaining the mixture at or above the temperature until said hybrid structure or compound is formed.

In a third embodiment of the fourth aspect, the present disclosure provides a method for preparing a crystalline inorganic-organic hybrid structure or compound as defined in the first, the second, or the third aspect of the present disclosure, within the scope of the second embodiment, wherein the organic ligand compound is an organic amine or diamine selected from a pyridine or bis-pyridine compound or an organic amine or diamine having the formula R—$NH_2$ or $NH_2$—R—$NH_2$, wherein R is a $C_{2-9}$ alkyl or alkenyl group, a $C_{3-9}$ cycloalkyl or cycloalkenyl group, a $C_{6-12}$ aryl group, or a $C_{1-6}$ alkyl-$C_{6-12}$ aryl group, all of which are substituted or unsubstituted.

In a fourth embodiment of the fourth aspect, the present disclosure provides a method for preparing a crystalline inorganic-organic hybrid structure or compound as defined in the first, the second, or the third aspect of the present disclosure, within the scope of the second embodiment, wherein said organic ligand compound is an organic amine selected from 1-ethyl-amine, 1-propylamine, 1-butylamine, 1-pentylamine, 1-hexylamine, aniline and 4,4-bpy.

In a fifth embodiment of the fourth aspect, the present disclosure provides a method for preparing a crystalline inorganic-organic hybrid structure or compound, within the scope of the first embodiment, wherein said mixture further comprises a salt of $Mn^{2+}$.

In a sixth embodiment of the fourth aspect, the present disclosure provides a method for preparing a crystalline inorganic-organic hybrid structure or compound, within the scope of the fifth embodiment, wherein the amount of said salt of $Mn^{2+}$ is in the range from 0 mol % to about 50 mol % based upon the salt of II-VI semiconductor cationic species.

In a fifth aspect the present disclosure provides a semiconductor device comprising the inorganic-organic hybrid structure or compound as described in the first, second, or third aspect of the present disclosure.

In a sixth aspect the present disclosure provides a light emitting device comprising an inorganic-organic hybrid structure or compound as described in the first, second, or third aspect of the present disclosure.

The terms "II-VI semiconducting chalcogenide" and "II-VI chalcogenide compound," or other related similar terms, as used herein, are defined according to their well-understood meaning, in which the term chalcogenide is limited to S, Se and Te, and the semiconductor has a zinc blende or wurtzite structure. Cationic species of such semiconductor compounds include Zn, Cd, Hg, and Mn.

The term "organic ligand" or "organic ligand compound," as used herein, refers to any monofunctional organic compounds or bifunctional organic compounds capable of binding to the II-VI semiconductor cationic species to form ordered crystal lattices.

The term "monofunctional organic compound" or "monofunctional organic ligand," as used herein, refers to any neutral organic molecule with a single functional group capable of binding to the II-VI semiconductor cationic species to form ordered crystal lattices, including, but not limited to, monosubstituted organic amines, phosphines and mercaptans. Monofunctional organic compounds and ligands include aromatic compounds such as aniline and heteroaromatic compounds such as pyridine.

The term "bifuncational organic compound" or "bifunctional organic ligand," as used herein, refers to any neutral molecules having bifunctional binding sites, including, but not limited to, alkyl diamines, aryl diamines, organic diphosphines, and dithiols (HS—R—SH). Bifunctional organic compounds and ligand include aromatic compounds such as benzene diamine and aminopropylaniline and heteroaromatic compounds such as 4,4-bis-pyridine. They can also be molecules with bi-functional groups but only use one of the two to bind to the metals, such as in the case of 2D-ZnTe($H_2N$—$NH_2$), where only one of the two $NH_2$ binds to Zn.

By controlling experimental conditions, the double-layer structures can be synthesized selectively over the corresponding single-semiconductor layer structures disclosed by the above-referenced U.S. Pat. No. 6,536,186 by using reaction temperatures lower than those used to obtain the corresponding compound having a single semiconductor layer.

Figure 1B:
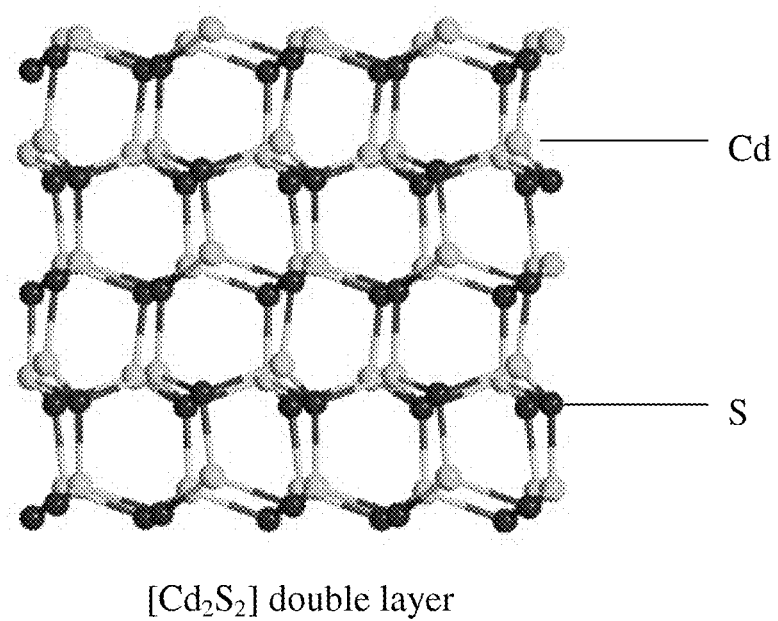
FIG. 1b is a representation of only the double layer of $Cd_2S_2$; Cd is in gray and S is in black. 2D-[$Cd_2Se_{0.5}S_{1.5}$(ba)] is a crystalline iso-structure of 2-D [$Cd_2S_2$(ba)].

The present invention is drawn to compositions and methods for new types of semiconductor bulk material which are capable of generating white light directly from a single semiconductor compound so that complex mixing/doping processes can be avoided. These materials are formed from liquid phase monofunctional and bis-functional organic compounds such as monoamines and diamines combined with cadmium chloride, sulfur, and sometimes selenium to form a unique family of inorganic-organic hybrid semiconductors. These highly crystalline materials are composed of predominantly two-dimensional infinite layers of II-VI semiconductor motifs (inorganic component) that are bonded by organic layers such as amine molecules to form perfectly ordered crystal lattices, as shown in FIG. 1(a) and FIG. 1(b). They not only possess a number of enhanced semiconductor properties with respect to their parent II-VI binary compounds, but also exhibit very strong structure-induced quantum confinement effects (QCE).

Unlike the existing white LEDs that are either made by combination of red, green and blue LEDs, or phosphor conversion by complex doping, these materials give direct white light from a single semiconductor compound crystal material and the emission properties can be systematically tuned. By using these single semiconductor compound bulk materials as a phosphor, complex mixing/doping processes can be avoided. These can be processed in bulk forms and have no limitations or restrictions on issues related to particle sizes. This invention eliminates the significant reduction of device efficiency due to problems such as self absorption, relatively low light capture efficiency of other phosphors or non-radiative carrier losses. Consequently they will be less expensive to both manufacture and operate.

Figure 2:
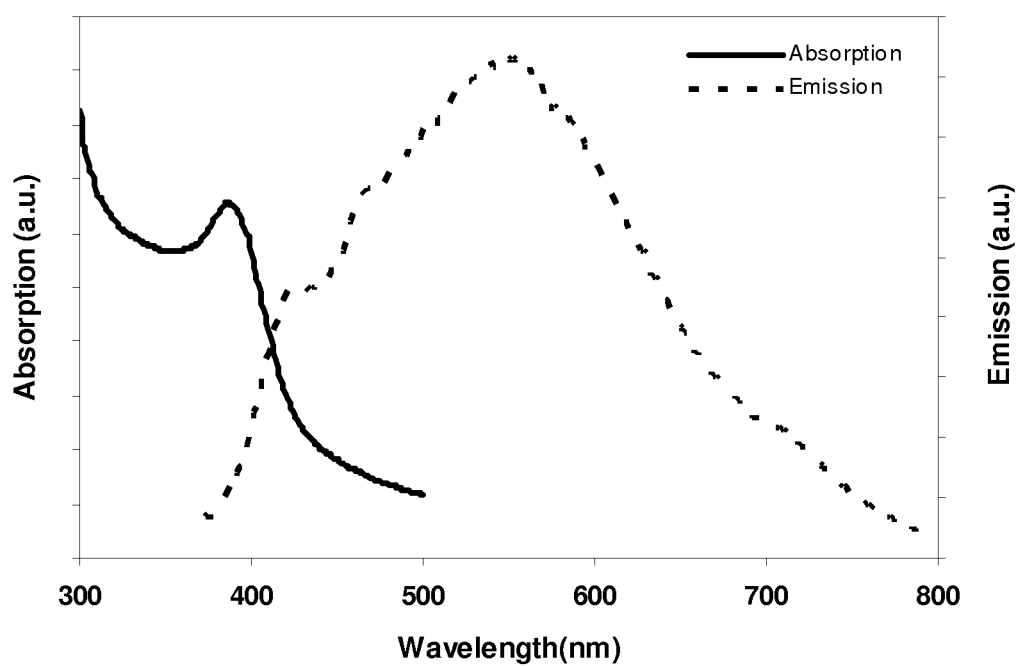
FIG. 2 is a graph of the room temperature absorption and emission spectra of 2D-[$Cd_2Se_{0.5}S_{1.5}$(ba)] obtained on a Shimadzu UV-3101PC double beam, double monochromated spectrophotometer and a Varian Cary Eclipse fluorometer ($\lambda_{ex}$=360 nm).
Figure 3:
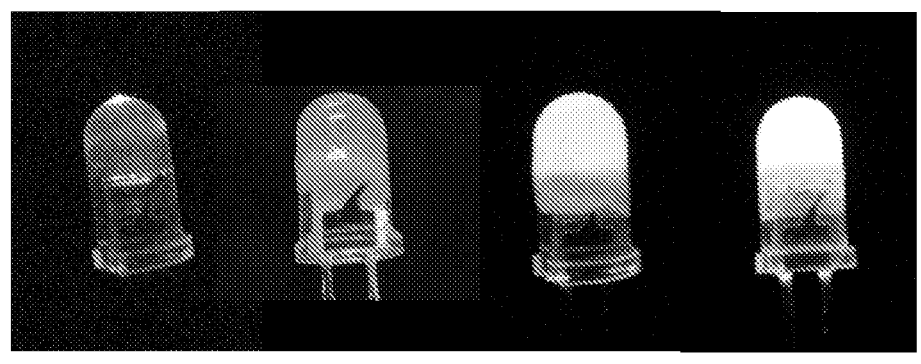
FIG. 3 shows photographs of the white light emission from the double double-layer 2D-[$Cd_2Se_{0.5}S_{1.5}$(ba)] based structures. (a) A 5 mm reference UV LED (360 nm) illuminating blue light; (b) The same LED coated with a thin layer of sample 2D-[$Cd_2Se_{0.5}S_{1.5}$(ba)] (before illumination); (c) The same LED illuminating a coated thin layer of sample 2D-[$Cd_2Se_{0.5}S_{1.5}$(ba)]; and (d) The same LED illuminating a coated thin layer of Mn doped 2D-[$Cd_2Se_{0.5}S_{1.5}$(ba)] (0.1 mol %).

The bulk semiconductor materials made from monoamines and diamines emit a broad spectrum of light. The broad emission covers the entire visible region and band edge emission is significantly reduced, leading to a more balanced white light spectrum, as shown in FIG. 2 and FIG. 3. A similar observation was reported for very small CdSe NCs. The phenomenon was ascribed to deep trap emission that takes place when a photogenerated hole is trapped in a midgap state (surface site) and combines with an electron before it relaxes back to the ground state via a nonradiative pathway (See, e.g., Bowers et al., *J. Am. Chem. Soc.*, 127, 1537815379 (2005); Underwood et al., *J. Phys. Chem. B*, 105, 436-443 (2001)).

Because of the very small particle size of CdSe NCs, the surface-to-volume ratio is very large, giving rise to dominating surface states, diminished band edge emission features, and a very broad emission.

Figure 8:
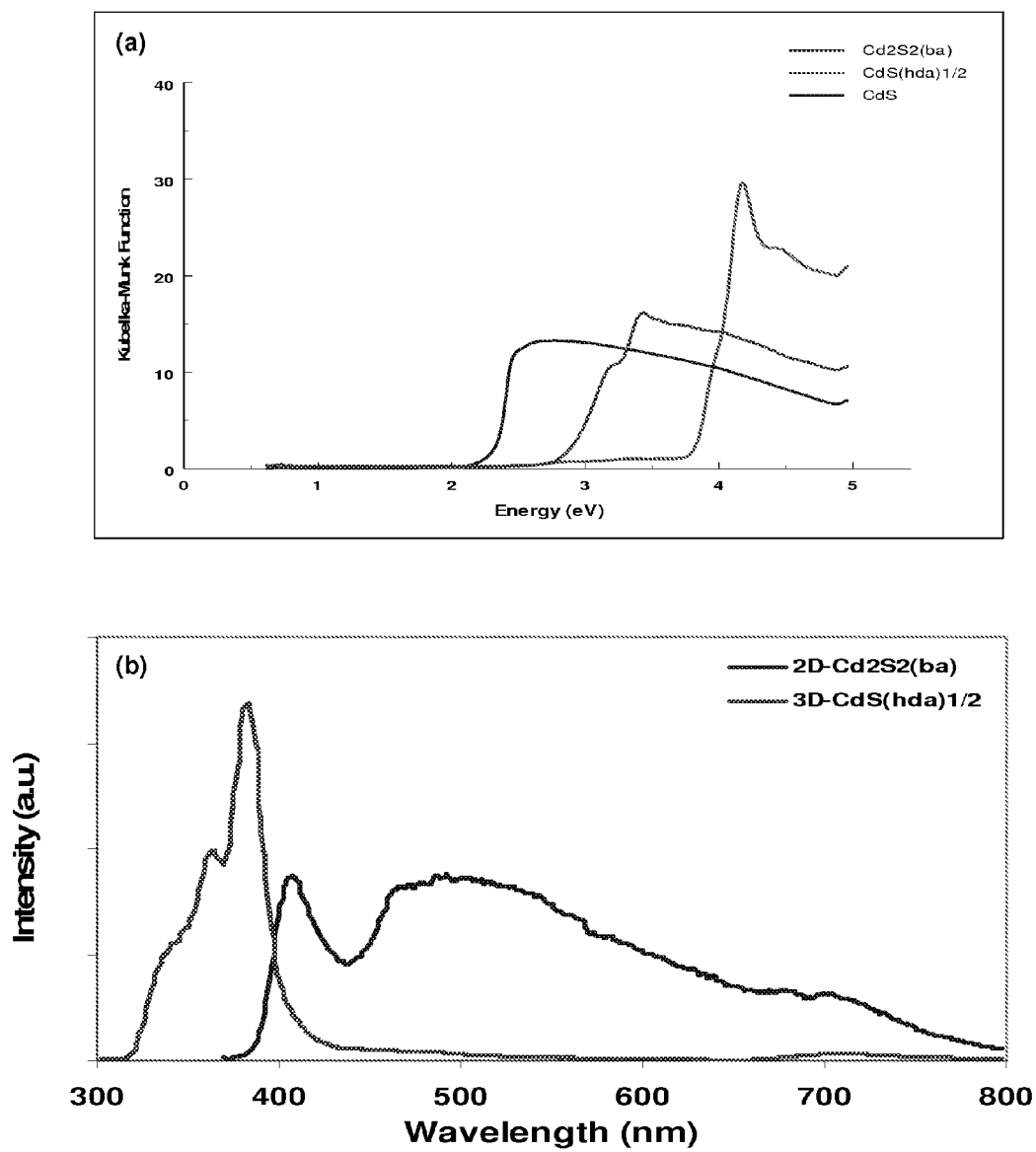
FIG. 8a is a graphical representation of various spectra. Room temperature optical absorption spectra of bulk CdS, double-layer 2D-[$Cd_2S_2$(ba)], and single-layer 3D-[$Cd_2S_2$(hda)] (hda=hexyldiamine) structure. The latter two show a blue shift of ~0.6 eV and 1.7 eV, respectively, with respect to the CdS parent.
FIG. 8b depicts the room temperature photoluminescence of a double-layer 2D-[$Cd_2S_2$(ba)] ($\lambda_{ex}$=360 nm) and a single-layer 3D-[$Cd_2S_2$(hda)] ($\lambda_{ex}$=280 nm) structure.
Figure 9A:
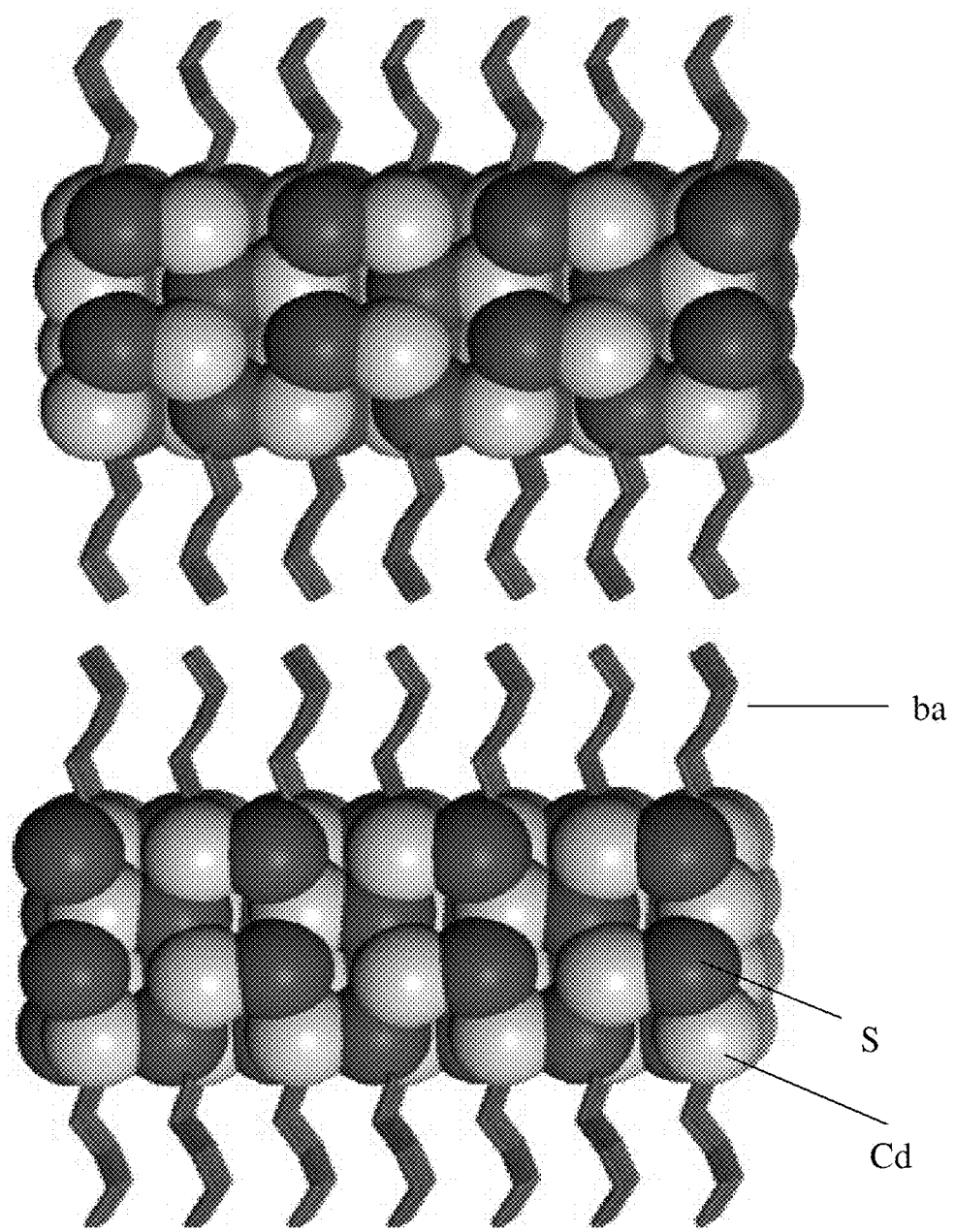
FIG. 9a depicts the crystalline structure of double-layer 2D-[$Cd_2S_2$(ba)] (ba=n-butyl-amine) structures. The planes in light gray indicate the surfaces of each layer within a unit cell.
Figure 9B:
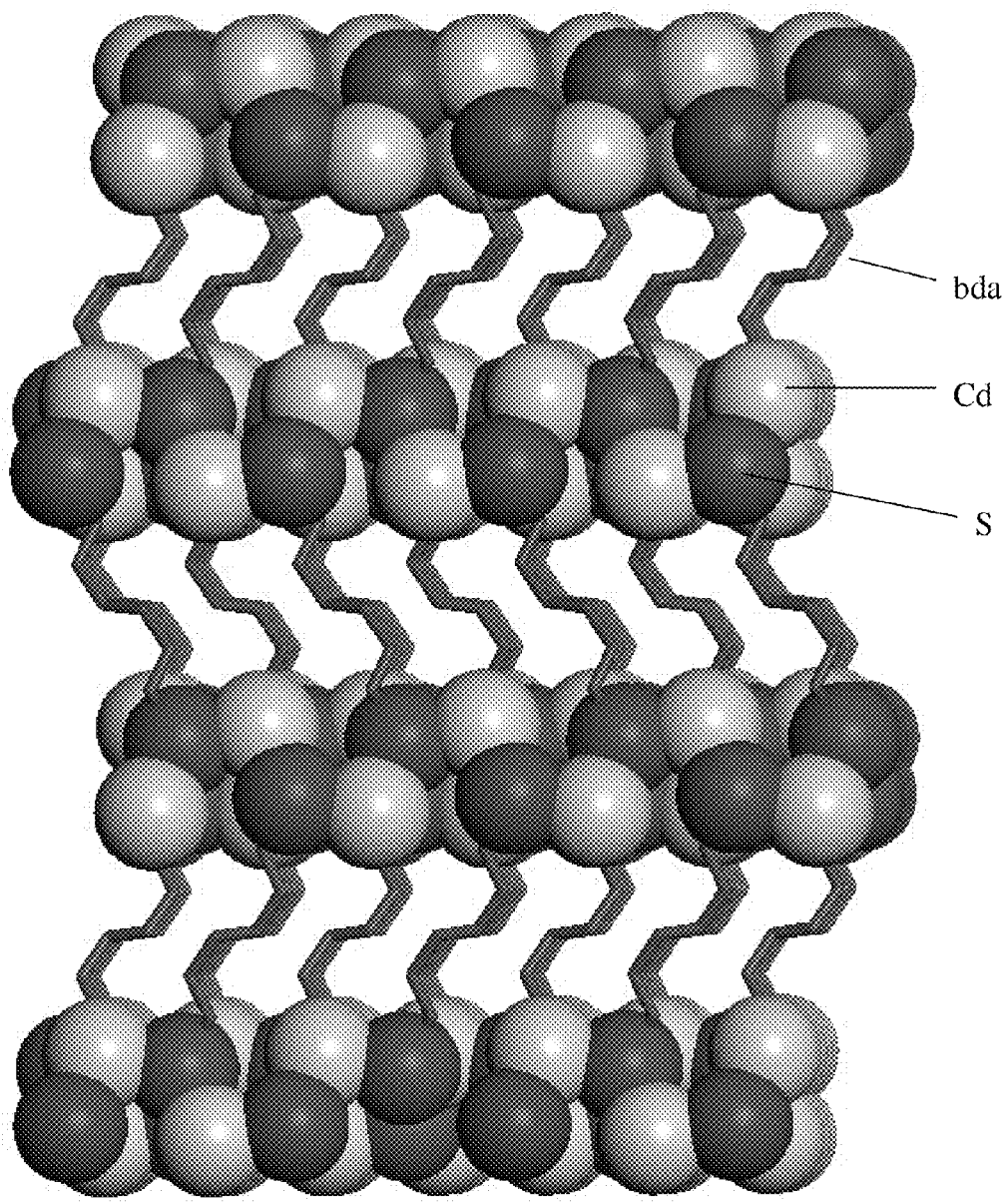
FIG. 9b depicts the crystalline structure of a single-layer 3D-[$Cd_2S_2$(bda)] (bda=n-butyldiamine) structure. Data used to generate the structure is based on $Zn_2Se_2$(bda), which is isostructural to 3D-[$Cd_2S_2$(bda)]. There are no surface sites within the unit cell.

The inventors have also discovered an interesting relationship between the crystal structures and the emission band width of the hybrid compounds. An example of single-layer 3D[MQ(L)$_{0.5}$] (M=Zn, Cd; Q=S, Se, and Te) type structure is shown in FIG. 9, 3D[Cd$_2$S$_2$(bda)] (bda=n-butyldiamine). As shown in FIG. 9(a), a two-dimensional (2D) double-layer structure such as 2D-[Cd$_2$S$_2$(ba)] has a very large number of surface sites within each crystal, due to the nature of its layered structure. A three-dimensional (3D) single-layer structure made of the same inorganic component, 3D-[Cd$_2$S$_2$(bda)] (FIG. 9(b)), however, possess no surface sites within each crystal. (Structure is based on the isostructure determined and reported for 3D-[ZnSe(dbn)$_{1/2}$].) (see Huang et al., *Mat. Res. Soc. Symp. Proc.*, Vol. 728 S1.7.1-S1.7.6 (2002)). The 3D structure exhibits a significantly narrower emission band width as shown in FIG. 8(b).

Figure 4:
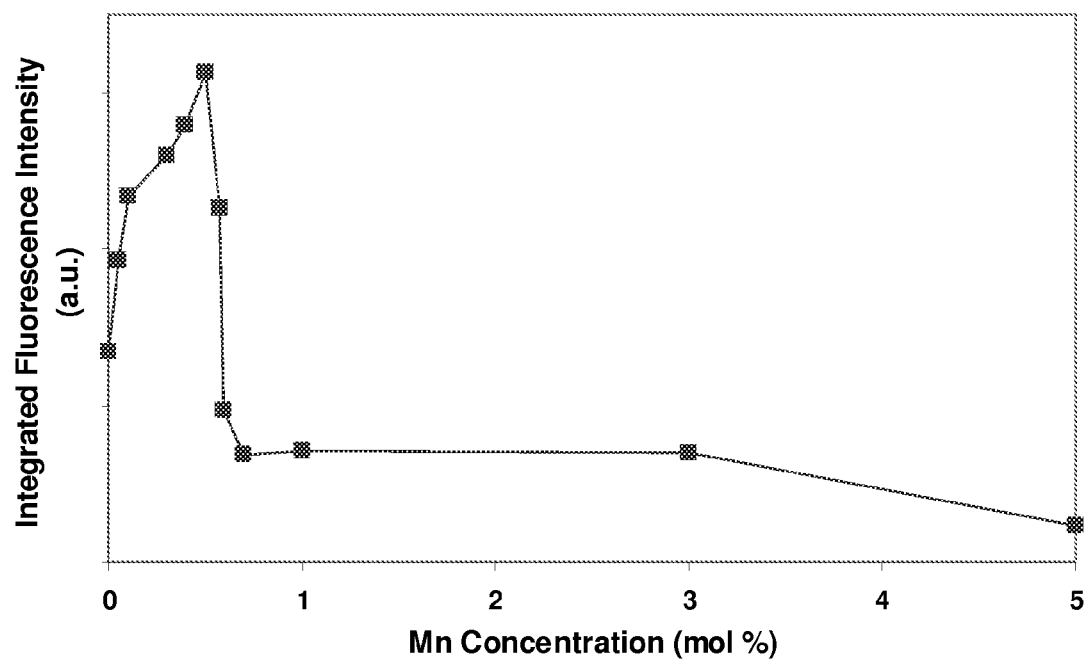
FIG. 4 is a line graph representing the integrated photoluminescence intensity (PL) ($\lambda_{ex}$=360 nm) as a function of manganese (Mn) concentration. The Mn dopant amount was in the range of 0-5 mol %.
Figure 5:
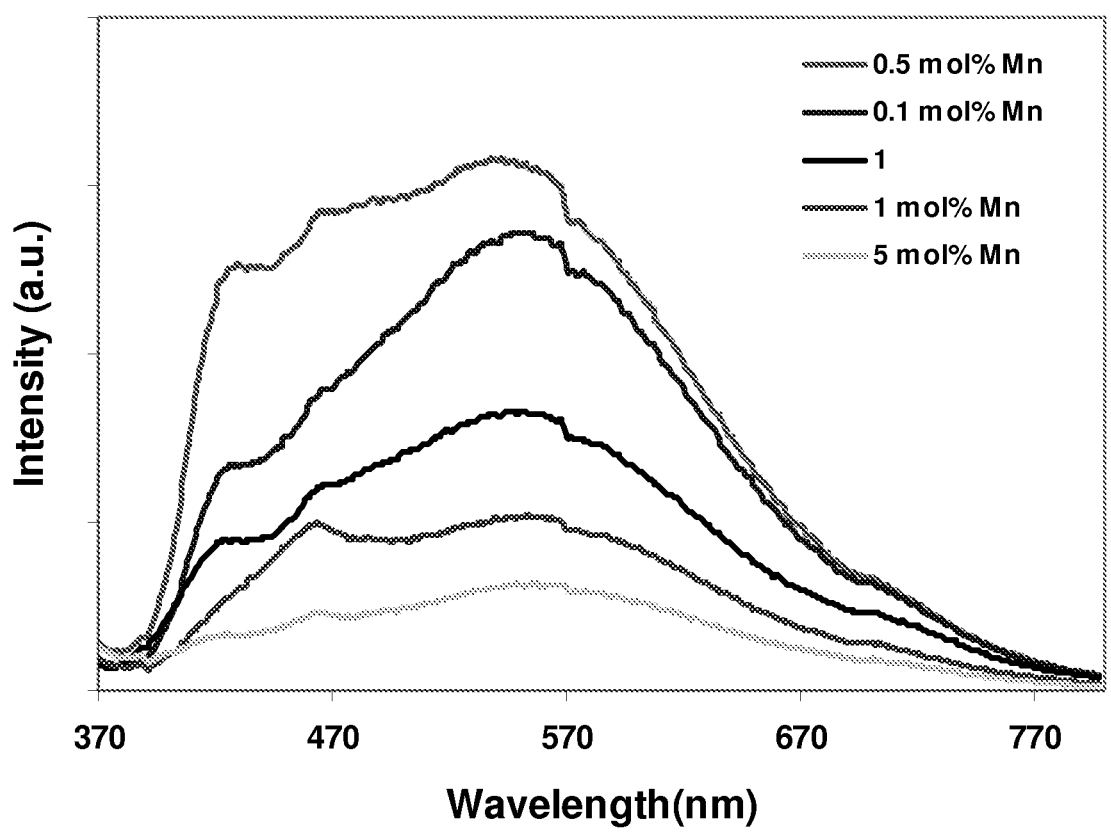
FIG. 5 is a line graph representing the room temperature photoluminescence of 2D-[$Cd_2Se_{0.5}S_{1.5}$(ba)] and manganese doped samples ($\lambda_{ex}$=360 nm) at various concentrations of manganese. The lines are in the same order as the legend with the top line representing 0.5 mol % Mn and the bottom line, 5 mol % Mn.
Figure 6:
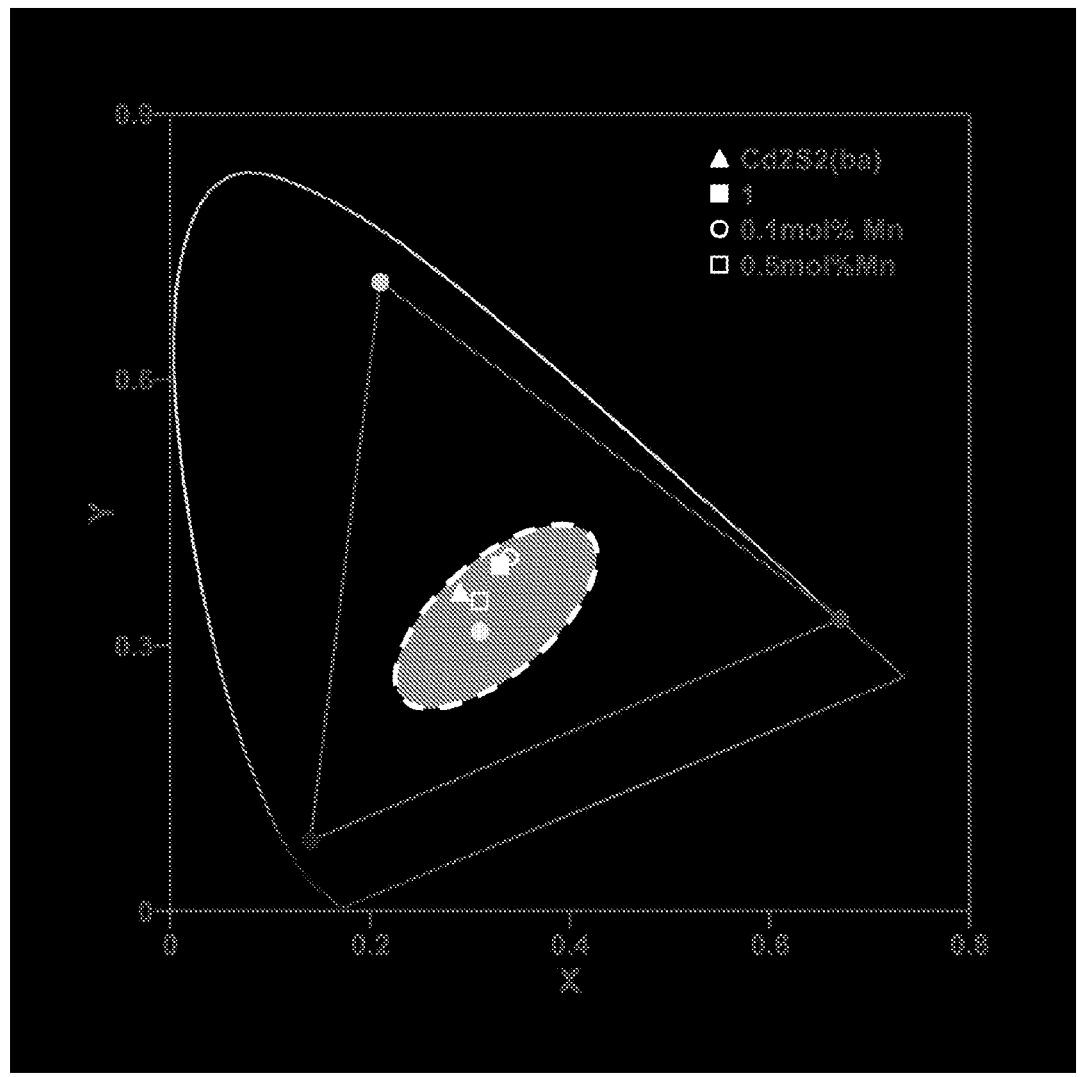
FIG. 6 is a graphical representation of the emitted light within the white light spectrum. CIE coordinates calculated using the software GoCIE obtained from http://www.geocities.com/krjustin/gocie.html. 1 (2D-[$Cd_2Se_{0.5}S_{1.5}$(ba)]): (0.33, 0.39); 0.1 mol % Mn doped 2D-[$Cd_2Se_{0.5}S_{1.5}$(ba)]: (0.34, 0.40); 0.5 mol % Mn doped 2D-[$Cd_2Se_{0.5}S_{1.5}$(ba)]: (0.33, 0.35) and 2D- [$Cd_2S_2$(ba)]: (0.31, 0.35). The CIE coordinates for the equi-energy white point (0.33, 0.33) are indicated by a white solid dot. The dashed white lines outline the white color region on CIE Chromaticity Diagram (grey area).

While doping with manganese is not required for the production of white light, it does enhance the photoluminescence intensity. Doping the 2D-[Cd$_2$Se$_{0.5}$S$_{1.5}$(ba)] by a small amount of manganese resulted in changes in the PL intensity. The highest PL intensity was achieved at a dopant level of 0.5 mol % of manganese, as shown in FIG. 4 and FIG. 5. The chromaticity coordinates for both 2D-[Cd$_2$Se$_{0.5}$S$_{1.5}$(ba)] and the manganese doped samples ranged well within the white region of the International Commission on Illumination (CIE) 1931 color space chromaticity diagram (CIE (1932), *Commission internationale de l'Eclairage proceedings* (Cambridge Univ. Press, 1931)). See FIG. 6. This discovery can be applied to create white LEDs that are cost effective and efficient light sources, and thus have potential to be used in general lighting applications.

Figure 7:
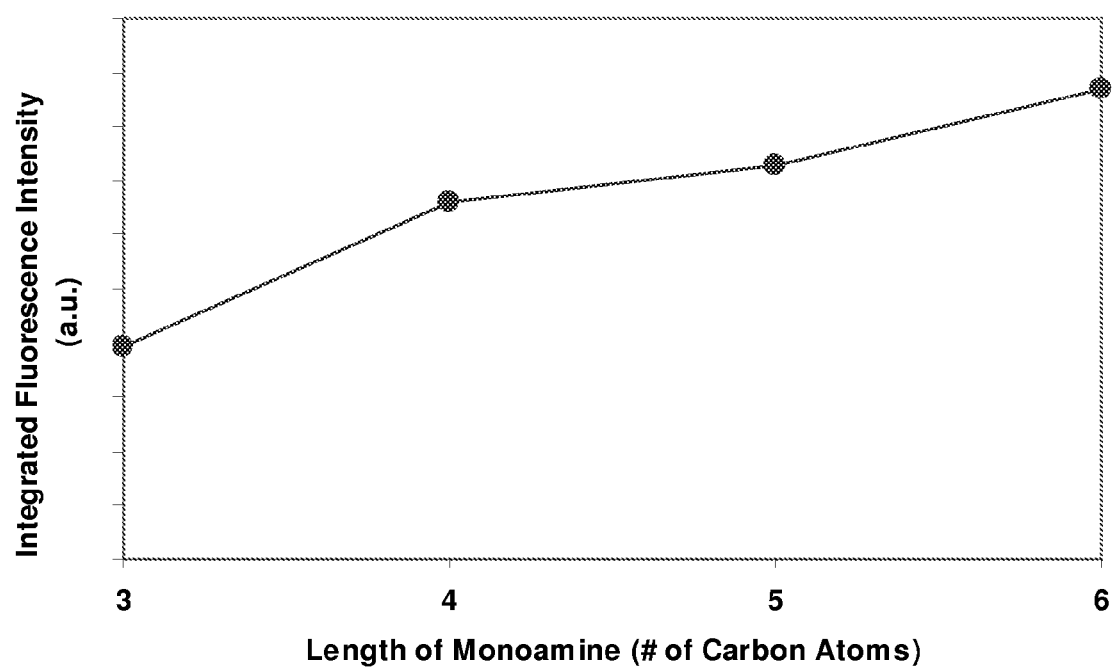
FIG. 7 is a line graph representing the integrated photoluminescence intensity (PL) intensity as a function of the amine length L (L=pa, ba, pta, and ha, ($\lambda_{ex}$=360 nm) The intensity increases as L increases.

In addition, the optical properties of these materials can be tuned systematically to enhance lighting power and efficiency by varying the chain length of the organic component, making them useful in general lighting applications, because the length (as an indication of number of carbon atoms) of the organic ligands (L) plays a role in the photoluminescence emission. For example, in the double-layer 2D-[Cd$_2$Se$_{0.25}$S$_{0.75}$(L)] series made from monoamines, the integrated intensities for L=propylamine, butylamine, pentylamine and hexylamine increase monotonically with the length of the alkyl chain, as shown in FIG. 7. This is attributable to the relative interactions between the adjacent layers. As the length of the amine molecules increases, the interlayer interactions of the inorganic slabs are weakened and the more prominent 2D confinement led to enhanced photoluminescence intensities.

Method of Preparation

The inorganic-organic hybrid compounds of the present invention are prepared by the reaction of metal salts of one or more II-VI semiconductor cationic species, for example, a cationic halide, sulfate or nitrate salt, with one or more chalcogen elements selected from S, Te and Se, optionally in the form of A$_2$Q (A=alkali metal, Q=S, Se or Te). Preferred cationic species include Zn and Cd. The metal salt and the chalcogen are reacted in the presence of the organic ligand compounds, with the molar ratio of metal to chalcogen being between about 4:1 and about 1:1. Preferably, the molar ratio is between about 2:1 and about 1:1.

The organic ligand compounds may serve the dual functions of solvent and reactant. However, the invention also encompasses methods wherein an inert solvent such as water, dimethylformamide, and the like are employed. In a preferred embodiment, the organic ligand compound serves as reactant and solvent wherein the molar ratio of metal salt to chalcogen to the organic ligand compound is a ratio between about 2:1:5 and about 2:1:600.

Selected changes in the molar proportions of reactants provide desired changes in the chemical and/or physical properties of the inventive compounds, including, for example, the thickness of the hybrid structure, the selection for which is readily understood by those skilled in the art. In a preferred embodiment in which the organic ligand compound functions as both reactant and solvent, the molar proportion of the organic ligand compound is about 5 to 600 times that of the amount of chalcogen employed.

The compounds of the present invention are prepared in an open vessel under ambient conditions, or in a closed vessel, such as a stainless steel acid digestion bomb. The closed reactions are carried out under autogenic pressure of about three atm. up to about 100 atm.

Suitable reaction temperatures range from 60° C. to about 200° C., and preferably from about 80° C. to about 100° C., and the reaction period is suitably from about one to ten days.

Solid products are collected by conventional means, washed free of starting materials and impurities with appropriate solvents such as alcohol-water, and then dried with an anhydrous solvent such as ethyl ether.

In an alternative embodiment, the II-VI semiconductor chalcogenide component is provided as a precursor which is reacted directly with the organic ligand compounds at elevated temperatures and pressure to form the compounds of the present invention. For example, the II-VI semiconducting chalcogenide can be reacted with propylamine or pentylamine at 80° C. for 3-4 days, or reacted with butylamine or hexylamine at 100° C. for 2-3 days.

The compounds of the present invention may be configured into structures that are useful in the fabrication of electrical and optical devices by conventional means well known to those of ordinary skill in the art. For example, the compounds of the present invention may be formed into structures that function as quantum dots, quantum wells and quantum wires. Generally speaking, the compounds of the present invention will find applications in devices where these quantum confined structures are useful. These include, but are not limited to, interlayer dielectric devices in microelectronics, thermoelectric devices for cooling, beating and generating electricity, and quantum well laser structures useful in optoelectric devices for the generation or modulation of light radiation, including the modulation of light radiation for the transmission of information. The semiconductor compounds of the present invention may also be used in infra-red photodetectors, lasers for spectroscopic and fiber optic applications, electroluminescent lasers and electronic phosphors. In particular, the inorganic-organic hybrid compounds may be used in light-emitting devices to generate direct white light.

The present invention is described more fully by way of the following non-limiting examples. All parts and percentages are molar unless otherwise noted and all temperatures are in degrees Celsius. All references cited herein in the entire document are hereby incorporated by reference in their entirety.

EXAMPLES

Example 1

Preparation of 2D-[$Cd_2Se_{0.5}S_{1.5}$(ba)]

Methods and Materials
Cadmium Chloride ($CdCl_2$), Sulfur (S), Selenium (Se) and n-Butylamine (ba)
  Acid digestion bomb
  Shimadzu UV-3101PC double-beam, double-monochromated spectrophotometer, Varian Cary Eclipse fluorometer and Rigaku D/M-2200T automated diffractometer (Ultima+)
  Example 1 was prepared from a reaction of $CdCl_2$ (2 mmol), S (0.75 mmol), Se (0.25 mmol) and ba (6 mL) in a 25 mL acid digestion bomb at 100° C. for 2 days. A yield of 82.6% based on S was achieved.
  Absorption and emission spectra of 2D-[$Cd_2Se_{0.5}S_{1.5}$(ba)] were obtained using the above instruments. The excitation wavelength for the emission spectra was set at λ=360 nm. Powder X-ray diffraction experiments were carried out on a Rigaku D/M-2200T automated diffractometer (Ultima®+) using Cu Ka radiation (λ=1.5406 Å).
  The absorption and emission spectra of the compound are plotted in FIG. 2. The broad emission covers the entire visible spectrum and interestingly, no strong band edge emission is observed.
  Crystallographic studies by powder x-ray diffraction were conducted on the resulting material. Shown in FIG. 1a is a 2D-[$Cd_2S_2$(ba)] based double-layer structure. A view of the double layer is depicted in FIG. 1b. There are two types of Cd atoms within the layer. Cd(1) atom coordinates to four S atoms to form a distorted tetrahedron. Cd(2) makes bonds to three S and one N atom of ba. There are also two crystallographically independent S atoms. One bonds to four Cd atoms tetrahedrally and the other is three-fold coordinated to three metal atoms. The double-layer [$Cd_2S_2$] slab (FIG. 1b) can be regarded as a slice cut from the (110) crystal face of the hexagonal structure of CdS, with both chair and boat conformations of the six-member rings. 2D-[$Cd_2S_2$(ba)] is an isostructure of 2D-[$Cd_2Se_{0.5}S_{1.5}$(ba)], the selenium substitutes for the sulfur in the crystal lattice.

Example 2

Preparation of 2D-[$Cd_2S_2$(ba)]

Methods and Materials
Cadmium Chloride ($CdCl_2$), Sulfur (S), and n-Butylamine (ba)
  Example 2 was prepared from a reaction of $CdCl_2$ (2 mmol), S (1 mmol) and ba (6 mL) in a 25 mL acid digestion bomb at 100° C. for 2 days. Powder X-ray diffraction experiments were carried out as in Example 1.
  Crystallographic studies by powder x-ray diffraction were conducted on the resulting material. See FIG. 1 and the explanation in Example 1 above.

Example 3

Coating UV-LED with 2D-[$Cd_2Se_{0.5}S_{1.5}$(ba)] and Mn-doped 2D-[$Cd_2Se_{0.5}S_{1.5}$(ba)]

Methods and Materials
Materials in example 1; Manganese acetate tetrahydrate [$Mn(CH_3COO)_2 \cdot 4H_2O$], ethanol, distilled water, and dimethyl sulfoxide, DMSO Ultrasonic processor, Model VCX-750, Sonics & Materials, Inc. 5 mm reference UV LED (360 nm) illuminating blue light commercially available from Le Group Fox, Inc. (FIG. 3a)
  A thin layer of yellowish colored 2D-[$Cd_2Se_{0.5}S_{1.5}$(ba)] prepared from a DMSO solution was coated onto the LED (FIG. 3b) and illuminated (FIG. 3c). The material used in coating was prepared by centrifugation of an as-made Example 1 in ethanol/distilled water, followed by centrifugation in DMSO to remove excess butylamine. The sample was then suspended in 10 mL DMSO and treated by an ultrasonic processor. The resultant solution was applied onto a commercial 360 nm UV-LED for white light demonstration.
  Mn doped samples, [$Cd_{2-x}Mn_xSe_{0.25}S_{0.75}$(ba)], were synthesized by reactions of $CdCl_2$, S, Se, butylamine and $Mn(CH_3COO)_2 \cdot 4H_2O$ at 0.1 mol % under the same conditions as for Example 1. A thin layer of this material was doped onto the thin layer of 2D-[$Cd_2Se_{0.5}S_{1.5}$(ba)] and illuminated again. (FIG. 3d).
  Upon illumination, both the 2D-[$Cd_2Se_{0.5}S_{1.5}$(ba)] coated LED and the Mn doped [$Cd_{2-x}Mn_xSe_{0.25}S_{0.75}$(ba)] coated LED generated white light (FIG. 3c, 3d). Manganese is known to enhance photoluminescence (PL) in numerous II-VI systems as well as in II-VI hybrid materials (Underwood et al., *J. Phys. Chem. B*, 105, 436-443 (2001); Norris et al., *Nano Lett.*, 1, 3-7 (2001); Yang et al., *J. Nanosci. Nanotechnol.*, 5, 1364-1375 (2005); Nag et al., *J. Phy. Chem. C*, 111, 13641-13644 (2007); Lu et al., *J. Phys. Chem. B*, 107, 3427-3430 (2003)). Doping by a small amount of Mn resulted in changes in the PL intensity. FIG. 3d shows a LED illuminating a coated thin layer of 2D-[$Cd_2Se_{0.5}S_{1.5}$(ba)] with 0.1 mol % of Mn doped material.

Example 4

Methods and Materials
  Materials as described above in Examples 1, 2, and 3. Methods of preparation as described in Examples 1, 2, and 3. Manganese doped samples were prepared at various molar concentration (x=0~5%) under the same conditions as in Example 1. Photoluminescence was measured as in Example 1.
  The highest photoluminescence intensity was achieved at a dopant level of 0.5 mol % of manganese (see FIGS. 4 and 5). The chromaticity coordinates range from 0.31 to 0.34 (x) and 0.35 to 0.40 (y) for 2D-[$Cd_2Se_{0.5}S_{1.5}$(ba)] and Mn doped samples, falling well within the white region of the International Commission on Illumination (CIE) 1931 color space chromaticity diagram (see FIG. 6).26

Example 5

Methods and Materials
  Monoamines such as propylamine (pa), butylamine (ba), pentylamine (pta), hexylamine (ha); materials as in example 1.
  Example 5 materials were prepared from a reaction of CdCl2 (2 mmol), S (0.75 mmol), and Se (0.25 mmol) and monoamine(6 mL) in a 25 mL acid digestion bomb.
  The following were the reaction conditions for each monoamine:
    Propylamine at 80° C. for 3 days;
    Butylamine at 100° C. for 2 days;
    Pentylamine at 80° C. for 4 days;
    Hexylamine at 100° C. for 3 days.
  Photoluminescence was measured as in example 1.
  The length of organic monoamines (L) also played a role in the PL emission. As the length of the amine molecules increased, PL intensities were enhanced. The same trend was seen in the double-layer 2D-[Cd$_2$Se$_{0.25}$S$_{0.75}$(L)] series. The integrated intensities for L=propylamine or pa, butylamine or ba, pentylamine or pta, and hexylamine or ha are plotted in FIG. 7.

Example 6

Methods and Materials

Materials as in Example 2; hexyldiamine (hda). 3-D-[CdS(hda)1/2 was synthesized from a reaction of CdCl$_2$ (2 mmol), S (1 mmol) and had (6 mL) in a 25 mL acid digestion bomb at 80° C. for 5 days.

The room temperature optical absorption spectra of bulk CdS, double-layer D[Cd$_2$S$_2$(ba)], and single-layer 3D-[Cd$_2$S$_2$(hda)] (hda=hexyldiamine) structure showed a blue shift of ~0.6 eV and 1.7 eV, respectively, with respect to the CdS parent. (See FIG. 8($a$)). The room temperature photoluminescence of the double-layer 2D-[Cd$_2$S$_2$(ba)] ($\lambda_{ex}$=360 nm) and a single-layer 3D-[Cd$_2$S$_2$(hda)] ($\lambda_{ex}$=280 nm) is shown in FIG. 8($b$).

What is claimed is:

1. A crystalline inorganic-organic hybrid structure comprising a plurality of layers of a repeating unit, said repeating unit comprising a first organic ligand layer, a second organic ligand layer, and a two-dimensional semiconducting inorganic double layer having two opposing surfaces therebetween, wherein:
   the two-dimensional semiconducting inorganic double layer comprises two single atom thick layers of a II-VI chalcogenide compound of formula M$_{2-x}$Mn$_x$X$_j$Y$_{2-j}$, wherein M is a II-VI semiconductor cationic species, X and Y are two different chalcogens, j is a number greater than 0 but smaller than 2, and x is a number in the range from 0 to about 1.0, inclusive; and
   the first organic ligand layer and the second organic ligand layer are attached to the two opposing surfaces of the two-dimensional semiconducting inorganic double layer through a covalent bond or a coordinate covalent bond between said compounds of said organic ligand layers and the metal cation species of the II-VI chalcogenide compounds, so that the semiconducting inorganic double layer is directed by the compounds of the two opposing organic layers to form ordered crystal lattices.

2. The crystalline inorganic-organic hybrid structure of claim 1, wherein x is 0, and the II-VI chalcogenide compound has the formula M$_2$X$_j$Y$_{2-j}$, wherein:
   M is Cd or Zn;
   X and Y are each independently selected from the group consisting of S, Se and Te; and
   j is a number greater than 0 but smaller than 2.

3. The crystalline inorganic-organic hybrid structure of claim 1, wherein the II-VI chalcogenide compound is selected from the group consisting of Cd$_2$Se$_{0.5}$S$_{1.5}$, and Cd$_2$Se$_{0.75}$S$_{1.25}$.

4. The crystalline inorganic-organic hybrid structure of claim 1, wherein:
   M is Cd or Zn;
   X and Y are each a chalcogen independently selected from S, Se, and Te;
   j is a number greater than 0 but smaller than 2; and
   x is a number in the range from 0 to about 1.0, inclusive.

5. The crystalline inorganic-organic hybrid structure of claim 1, wherein the II-VI chalcogenide compound has the formula Cd$_{2-x}$Mn$_x$Se$_{0.75}$S$_{1.25}$, wherein x is a number in the range from 0 to about 1.0, inclusive.

6. The crystalline inorganic-organic hybrid structure of claim 1, wherein said first and said second organic ligand layers each comprise a layer of an organic amine or diamine compound.

7. The crystalline inorganic-organic hybrid structure of claim 6, wherein said organic amine or diamine is selected from the group consisting of 1-ethylamine, 1-propylamine, 1-butylamine, 1-pentylamine, 1-hexylamine, aniline and 4,4-bispyridine.

8. The crystalline inorganic-organic hybrid structure of claim 1, capable of emitting a light in the range of wavelength from about 380 nm to about 750 nm.

9. A crystalline inorganic-organic hybrid compound, characterized by formula M$_2$X$_j$Y$_{2-j}$(L), wherein:
   M is Cd or Zn;
   X and Y are two different chalcogens independently selected from S, Se, and Te;
   j is a number greater than 0 but smaller than 2; and
   L is an organic ligand compound.

10. The crystalline inorganic-organic hybrid compound of claim 9, wherein:
    M is Cd;
    X is Se;
    Y is S;
    j is selected from 0.25, 0.5, 0.75, and 1.0; and
    L is an organic amine or an organic diamine.

11. The crystalline inorganic-organic hybrid compound of claim 9 having a formula Cd$_2$Se$_{0.5}$S$_{1.5}$(ba), wherein ba is 1-butylamine.

12. A crystalline inorganic-organic hybrid compound, characterized by formula M$_{2-x}$Mn$_x$X$_j$Y$_{2-j}$(L), wherein:
    M is Cd or Zn;
    X and Y are two different chalcogens independently selected from S, Se, and Te;
    j is a number greater than 0 but smaller than 2;
    x is a number in the range from 0 to about 1.0, inclusive; and
    L is an organic ligand compound.

13. The crystalline inorganic-organic hybrid compound of claim 12, wherein:
    M is Cd;
    X is Se;
    Y is S;
    j is selected from 0.25, 0.5, 0.75, and 1.0;
    x is a number in the range from 0 to 0.01; and
    L is an organic amine or an organic diamine.

14. The crystalline inorganic-organic hybrid compound of claim 12, selected from the group consisting of Cd$_{1-x}$Mn$_x$S$_2$(ba), Cd$_{1-x}$Mn$_x$Se$_{0.5}$S$_{1.5}$(ba), and Cd$_{1-x}$Mn$_x$Se$_{0.25}$S$_{0.75}$(ba), wherein:
    x is a number in the range from 0 to 0.01, inclusive; and
    ba is 1-butylamine.

15. A method for preparing a crystalline inorganic-organic hybrid structure or compound, comprising a step of heating a mixture comprising:
    (a) a salt of one or more II-VI semiconductor cationic species,
    (b) two different chalcogens independently selected from the group consisting of S, Se and Te, and
    (c) an organic ligand compound capable of forming a covalent or coordinate bond with said II-VI semiconductor cationic species,
    to a temperature effective to form said hybrid structure or compound; and maintaining the mixture at or above the temperature until said hybrid structure or compound is formed.

16. The method of claim 15, wherein:
(a) said II-VI semiconductor cationic species is selected from $Zn^{2+}$ and $Cd^{2+}$; and
(c) said organic ligand compound is an organic amine or an organic diamine.

17. The method of claim 16, wherein said organic amine or organic diamine is selected from the group consisting of 1-propylamine, 1-butylamine, 1-pentylamine, 1-hexylamine, aniline and 4,4-bispyridine.

18. The method of claim 15, wherein said mixture further comprises a salt of $Mn^{2+}$.

19. The method of claim 18, wherein the amount of said salt of $Mn^{2+}$ is in the range from 0 mol % to about 5 mol % based upon the salt of II-VI semiconductor cationic species.

20. A semiconductor device comprising the inorganic-organic hybrid structure or compound according to claim 1.

21. A light emitting device comprising the inorganic-organic hybrid structure or compound according to claim 1.

22. A semiconductor device comprising the inorganic-organic hybrid structure or compound according to claim 9.

23. A semiconductor device comprising the inorganic-organic hybrid structure or compound according to claim 12.

24. A light emitting device comprising the inorganic-organic hybrid structure or compound according to claim 9.

25. A light emitting device comprising the inorganic-organic hybrid structure or compound according to claim 12.

* * * * *